(12) United States Patent
Grant et al.

(10) Patent No.: US 9,224,480 B2
(45) Date of Patent: Dec. 29, 2015

(54) DUAL-FUNCTION READ/WRITE CACHE FOR PROGRAMMABLE NON-VOLATILE MEMORY

(71) Applicant: Texas Instruments Incorporated, Dallas, TX (US)

(72) Inventors: David Alexander Grant, Dallas, TX (US); Louis A. Williams, III, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1 day.

(21) Appl. No.: 14/192,038

(22) Filed: Feb. 27, 2014

(65) Prior Publication Data

US 2014/0241066 A1    Aug. 28, 2014

Related U.S. Application Data

(60) Provisional application No. 61/770,062, filed on Feb. 27, 2013.

(51) Int. Cl.
*G11C 16/10* (2006.01)
*G11C 16/26* (2006.01)
*G11C 16/06* (2006.01)

(52) U.S. Cl.
CPC ............... *G11C 16/10* (2013.01); *G11C 16/06* (2013.01); *G11C 16/26* (2013.01)

(58) Field of Classification Search
CPC ................................ G11C 16/10; G11C 16/26
USPC ..................................................... 365/185.18
See application file for complete search history.

(56) References Cited

U.S. PATENT DOCUMENTS

| | | | | |
|---|---|---|---|---|
| 6,717,857 | B2 * | 4/2004 | Byeon et al. | 365/185.21 |
| 7,023,741 | B2 * | 4/2006 | Nakamura et al. | 365/189.04 |
| 7,450,419 | B2 * | 11/2008 | Sakashita et al. | 365/185.08 |
| 7,986,557 | B2 * | 7/2011 | Tokiwa et al. | 365/185.17 |

* cited by examiner

*Primary Examiner* — Hoai V Ho
*Assistant Examiner* — Tri Hoang
(74) *Attorney, Agent, or Firm* — Rose Alyssa Keagy; Frank D. Cimino

(57) ABSTRACT

A non-volatile memory, such as a one-time programmable memory, with a dual purpose read/write cache. The read/write cache is used as a write cache during programming, and stores the data to be written for a full row of the memory array. The programming operation simultaneously programs all cells in the selected row based on the contents of the write cache. In subsequent read operations, the read/write cache is used as a read cache. A full row of the array is simultaneously read in a read access, and the contents of that row are stored in the read cache. Subsequent access to that same row causes the data to be read from the read cache rather than requiring access of the array.

13 Claims, 6 Drawing Sheets

DUAL-FUNCTION READ/WRITE CACHE FOR PROGRAMMABLE NON-VOLATILE MEMORY

CROSS-REFERENCE TO RELATED APPLICATIONS

This application claims priority, under 35 U.S.C. §119(e), of Provisional Application No. 61/770,062, filed Feb. 27, 2013, and incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention more specifically pertain to the programming and reading of one-time programmable non-volatile memory.

Non-volatile solid-state read/write memory devices are commonplace in many modern electronic systems, particularly in portable electronic devices and systems. Conventional types of non-volatile solid-state memory devices include those referred to as electrically programmable read-only memory (EPROM) devices. Modern EPROM memory cells include one or more "floating-gate" transistors that store the data state. In a general sense, these floating-gate transistors are "programmed" by the application of a bias that enables holes or electrons to tunnel or be injected through a thin dielectric film onto an electrically isolated transistor gate element, which is the floating gate of the transistor. This trapped charge on the floating gate will modulate the apparent threshold voltage of the memory cell transistor, as compared with the threshold voltage with no charge trapped on the floating gate. This difference in threshold voltage can be detected by sensing the resulting difference in source-drain conduction, under normal transistor bias conditions, between the programmed and unprogrammed states. Some EPROM devices are "erasable" in that the trapped charge can be removed from the floating gate, for example by exposure of the memory cells to ultraviolet light (such memories referred to as "UV EPROMS") or by application of a particular electrical bias condition that enables tunneling of the charge from the floating gate (such memories referred to as electrically-erasable or electrically-alterable, i.e., EEPROMs and EAPROMS, respectively). "Flash" memory devices are typically realized by EEPROM memory arrays in which the erase operation is applied simultaneously to a "block" of memory cells.

Because of the convenience and efficiency of modern EPROM and EEPROM functions, it is now commonplace to embed non-volatile memory arrays within larger scale integrated circuits, such as modern complex microprocessors, digital signal processors, and other large-scale logic circuitry. Such embedded non-volatile memories can be used as non-volatile program memory storing software routines executable by the processor, and also as non-volatile data storage. On a smaller scale, non-volatile memory cells can realize control registers by way of which a larger scale logic circuit can be configured, or can be used to "trim" analog levels after electrical measurement.

As known in the art, "one-time programmable" ("OTP") memories are also popular, especially in embedded non-volatile memory applications as mentioned above. The memory cells of OTP memories are constructed similarly or identically as UV EPROM cells, and as such are not electrically erasable. But when mounted in an opaque package, without a window through which the memory can be exposed to ultraviolet light, the UV EPROM cells may be programmed one and only one time. In embedded applications, OTP memories are useful for storing the program code to be executed by the embedding microcontroller or microprocessor.

FIG. 1 illustrates the construction of conventional non-volatile memory cell $5_{j,k}$, which resides in a row j and column k of an EPROM array. In this example, cell $5_{j,k}$ includes p-channel metal-oxide semiconductor (MOS) select transistor 2, p-channel MOS floating-gate transistor 4, and n-channel MOS precharge transistor 6, with their source-drain paths connected in series between a high bias voltage Vhi and a low bias voltage Vlo (which may be at ground, for example). The gate of transistor 2 receives word line $WL_j^*$ for the row j in which cell $5_{j,k}$ resides (and which is a negative logic signal, as indicated by the *), and the gate of transistor 6 receives precharge signal PCHG. The gate of floating-gate transistor 4 is left floating in this example. Sense node SN is at the common drain node of transistors 4 and 6, and is connected to read amplifier 8 (either directly, or via select circuitry). In this example, read circuit 8 includes a buffer and Schmitt trigger in series, but may alternatively be arranged in any one of a number of known configurations.

Floating-gate transistor 4 is programmable by the application of a particular bias condition to its source and drain to cause electrons or holes to tunnel or be injected from the source or drain of transistor 4 into its floating gate electrode, and become trapped there. In some instances, the gate of select transistor 2 physically overlies, at least in part, the gate of floating-gate transistor 4 (e.g., in a "split-gate" arrangement), such that its voltage also plays a role in the programming mechanism. In UV EPROMs (and OTPs), the trapped charge will remain at the floating gate electrode indefinitely, subject to leakage or until photoelectrically recombined. In electrically erasable memories, an erase electrode (not shown in FIG. 1) provides the necessary bias for reverse tunneling of the trapped charge. In either case, the trapped charge modulates the threshold voltage of transistor 4, typically in a binary sense so that transistor 4 either conducts or does not conduct upon select transistor 2 being turned on. In the particular example of FIG. 1, p-channel floating gate transistor 4 is considered programmed to a "1" data state if electrons are trapped on its floating gate electrode as a result of the programming operation. In this "1" programmed state, transistor 4 will conduct if it conducts with the application of a negative drain-to-source voltage. Conversely, the "0" data state corresponds to electrons not being trapped on the floating gate electrode of transistor 4, such that transistor 4 does not conduct with the application of a negative drain-to-source voltage.

In operation, the read cycle for cell $5_{j,k}$ begins with precharge signal PCHG being driven active high, which turns on precharge transistor 6; select transistor 2 is held off during this precharge operation, by word line $WL_j^*$ being inactive at a logic high level. This operation discharges sense node SN to voltage Vlo, following which precharge signal PCHG is driven inactive low to isolate sense node SN from voltage Vlo. The read of the state of floating-gate transistor 4 is then accomplished by word line $WL_j^*$ being driven active to a logic low level, for example in response to a memory address selecting row j in which cell $5_{j,k}$ resides. Select transistor 2 is turned on by word line $WL_j^*$ driven low, placing a high voltage Vhi (less any voltage drop across transistor 2) at the source of floating-gate transistor 4. If floating-gate transistor 4 has been programmed to its "1" state (i.e., electrons are trapped at its floating gate electrode, reducing the threshold voltage of the device), the negative drain-to-source voltage across transistor 4 will result in source/drain conduction, pulling the voltage at sense node SN high toward voltage Vhi. Conversely, if floating-gate transistor 4 is left in its unprogrammed "0" state (i.e., electrons are not trapped at its floating gate electrode), it will remain nominally non-conductive and sense node SN will remain at its discharged low level. In either case, the state of sense node SN will be communicated via read amplifier 8 to terminal D_OUT, and communicated externally from the memory in the conventional manner.

As known in the art, memory cells 5 including floating-gate transistors 4 are programmed by the application of a relatively high voltage differential across its terminals. In the particular case shown in FIG. 1, in which transistor 4 does not include a control gate or other terminal that establishes a gate voltage during programming, transistor 4 is programmed by the application of a relatively high source-drain voltage differential. For example, if p-channel transistor 4 is in its erased state, in which it does not conduct upon application of a nominal drain-to-source voltage for read cycles, transistor 4 will be programmed by applying a drain-to-source voltage high enough, and for a sufficient duration (typically a series of pulses) that electrons become trapped on its floating-gate electrode; enough trapped electrons will shift the threshold voltage sufficiently so that transistor 4 conducts upon application of the nominal read cycle drain-to-source voltage. In modern floating-gate non-volatile memory cells, the programming time for a single memory cell 5 is on the order of 200 μsec. Even if a number of cells are programmed simultaneously, the time required to program a memory of significant size can be significant.

The manufacture of integrated circuits including non-volatile memories, including one-time-programmable memories, requires testing of the integrated circuits to ensure that any data pattern can be programmed to and read from the memory array. For those one-time programmable memories that are UV-erasable, a typical manufacturing test flow performed on devices in wafer form will include programming several different data patterns (diagonal, checkerboard, all ones, etc.), and corresponding read cycles to verify the programmed data, in order to screen out those memory cells and devices that may suffer from various defects, including those that are pattern dependent. These programming steps are then followed by UV-erase. In many cases, the memory manufacturer also programs the finished one-time programmable memory (i.e., as packaged) with the customers' desired data pattern. As a result, it is common for the test flow of one-time programmable memories to include three, four, or even more programming operations. Given the relatively long programming time mentioned above, the manufacturing test time associated with these programming operations can be significant, as can the testing cost considering the high cost of modern integrated circuit test equipment.

By way of further background, the architectures of some non-volatile memories include column select circuitry that, in each read cycle, select which of the bit lines in the array are to be sensed by the read amplifiers based on the column address applied to the memory. For example in such an architecture, if the memory array includes 128 bit lines in each row (i.e., 128 memory cells are selected by the selected word line in each read cycle), the column select circuitry may include a hierarchy of multiplexers to select the desired number of bit lines (e.g., eight bit lines to read a data byte) according to the column address. These multiplexers in the column select circuitry necessarily present significant parasitic resistance and capacitance to the relatively weak bit line signal, which reduces read performance.

BRIEF SUMMARY OF THE INVENTION

Disclosed embodiments provide a non-volatile memory architecture that reduces the programming time required for programming the entire memory.

Disclosed embodiments provide such an architecture that reduces the test time for non-volatile memories of the one-time programmable type.

Disclosed embodiments provide such an architecture in which power consumption and read access time are improved for many read cycles in the typical usage of a one-time programmable memory.

Other objects and advantages of the disclosed embodiments will be apparent to those of ordinary skill in the art having reference to the following specification together with its drawings.

According to certain embodiments, a dual purpose cache is provided for an electrically programmable memory array, and used in both programming (i.e., write) and read operations. The cache may be constructed to have a storage element for each of the bit lines in a row of the memory array. For programming operations, the cache is loaded with the data to be programmed into the memory cells of a row of the array, and all memory cells in that row are then programmed simultaneously. The same cache is used in read operations, and is loaded with the data state of each cell in a selected row upon a read of that row. If the next row address is in the same row, the contents of the cache are read from the cache; if not, the cache is loaded with the contents of the row corresponding to the row address.

DETAILED DESCRIPTION OF THE INVENTION

The one or more embodiments described in this specification are implemented into electrically-programmable read-only memory (EPROM) constructed according to a metal-oxide-semiconductor (MOS) technology as it is contemplated that such implementation is particularly advantageous in that context. More specifically, embodiments of this invention will be described with reference to EPROM cells that are erasable by exposure to ultraviolet light (i.e., UV EPROMs) or that are not erasable at all (one-time-programmable ROMs, or "OTP" ROMs). However, it is also contemplated that this invention can provide benefit in other circuit and structure applications, for example electrically erasable non-volatile memories. Accordingly, it is to be understood that the following description is provided by way of example only, and is not intended to limit the true scope of this invention as claimed.

Figure 2:
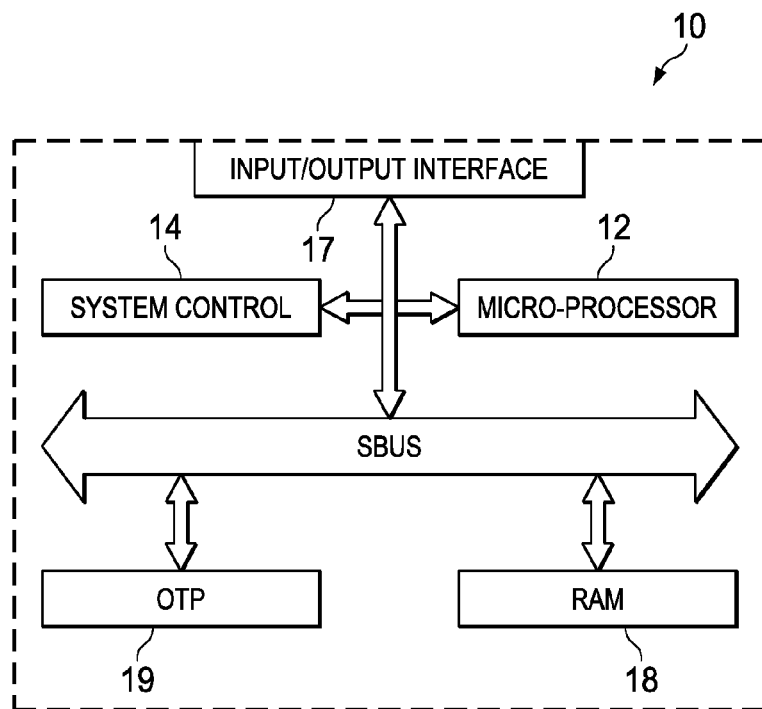
FIG. 2 is an electrical diagram, in block form, of a large scale integrated circuit constructed according to disclosed embodiments.

FIG. 2 illustrates an example of large-scale integrated circuit 10 in the form of a so-called "system-on-a-chip" ("SoC"), as now popular in many electronic systems. Integrated circuit 10 is a single-chip integrated circuit into which an entire computer architecture is realized. As such, in this example, integrated circuit 10 includes a central processing unit of microprocessor 12, which is connected to system bus SBUS. Various memory resources, including random access memory (RAM) 18 and one-time programmable read-only memory (OTP) 19, reside on system bus SBUS and are thus accessible to microprocessor 12.

In this example, OTP 19 is of a type that may be erasable by exposure to ultraviolet light, namely as a UV EPROM. In this example, if integrated circuit 10 is packaged in a conventional opaque package, OTP 19 may be programmed once after being packaged, and indeed will be a one-time programmable read-only memory. Alternatively, as will be mentioned below, if integrated circuit 10 is packaged with a window by way of which the memory array of OTP 19 is visible, OTP 19 may serve as a UV EPROM. Other implementations of this non-volatile memory shown in FIG. 2 as OTP 19 are contemplated, including electrically-erasable and flash implementations. In any case, OTP 19 in FIG. 2 is contemplated to typically serve as program memory storing the program instructions executable by microprocessor 12, while RAM 18 serves as data memory. In some cases, program instructions may reside in RAM 18 for recall and execution by microprocessor 12. Other system functions are shown in integrated circuit 10 in a generic sense, by way of system control 14 and input/output interface 17.

Those skilled in the art having reference to this specification will recognize that integrated circuit 10 may include additional or alternative functions to those shown in FIG. 2, or may have its functions arranged according to a different architecture from that shown in FIG. 2. The architecture and functionality of integrated circuit 10 is thus provided only by way of example, and is not intended to limit the scope of the claims.

Figure 3:
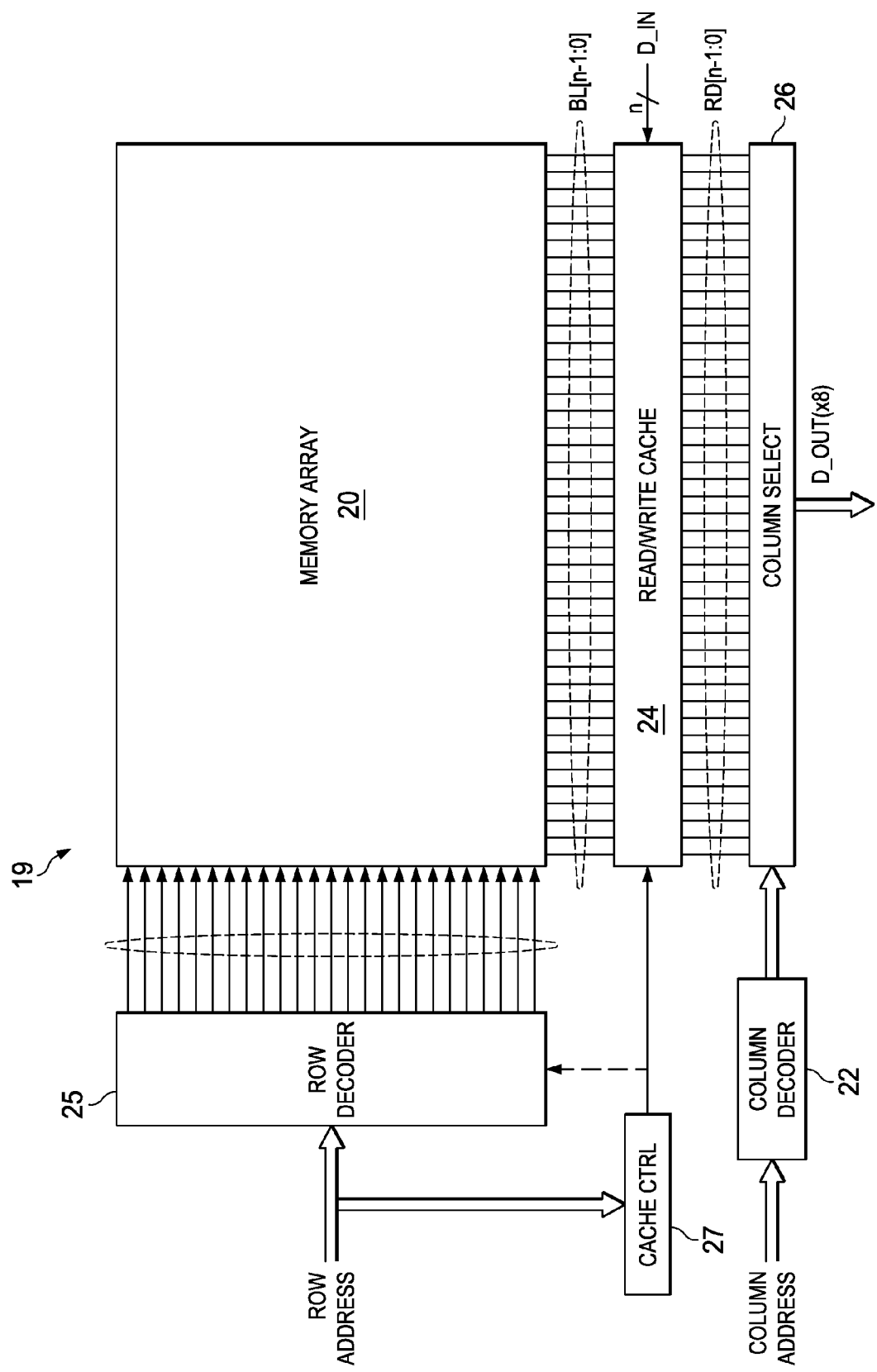
FIG. 3 is an electrical diagram, in block form, of a non-volatile memory in the integrated circuit of FIG. 2, constructed according to disclosed embodiments.

FIG. 3 illustrates an example of the architecture of OTP 19 according to embodiments of this invention. While FIG. 2 illustrates OTP 19 as embedded memory within larger-scale integrated circuit 10, OTP 19 may alternatively correspond to a stand-alone memory integrated circuit. Those skilled in the art having reference to this specification will also comprehend that the memory architecture of OTP 19 in FIG. 3 is provided by way of example only, and that the memory architecture of other embodiments may vary significantly from that shown in FIG. 3.

In this example, OTP 19 includes memory array 20 containing programmable read-only memory cells arranged in rows and columns. While a single instance of memory array 20 is shown in FIG. 3, it is to be understood that OTP 19 may include multiple memory arrays 20, each corresponding to a memory block within the address space of OTP 19. In the example shown in FIG. 3, memory array 20 includes m rows and n columns of floating-gate memory cells, each of which stores one data bit. In these embodiments, cells in the same column share a single bit line BL[n-1:0], and cells in the same row share one of word lines WL[m-1:0]. Memory array 20 may be alternatively arranged to include multiple array blocks or sub-arrays of cells, depending on the addressing space or memory architecture. Row decoder 25 receives a row address value indicating the row of memory array 20 to be accessed, and energizes the one of word lines WL[m-1:0] corresponding to that row address value, which couples the cells in the corresponding row to the corresponding bit line BL[n-1:0] for the associated columns, to present a voltage or current dependent on the data state stored in those cells.

In the architecture of FIG. 3, read/write cache 24 receives each of bit lines bit line BL[n-1:0], and includes read amplifier and storage element circuitry for receiving and retaining the data states read from each of the n cells in the selected row j of memory array 20, and presenting those data states on read lines RD[n-1:0]. Column decoder 22 receives at least a portion of a column address value, decodes that column address value, and generates column select signals that are applied to column select circuit 26. Column select circuit 26 responds to these column select signals by coupling output lines from the selected bit positions within read/write cache 24, corresponding to respective ones of bit lines BL[n-1:0], to communicate the data states for those selected bits via data bus D_OUT.

As mentioned above and as will be described in further detail below, read/write cache 24 also receives input data, via bus D_IN, and stores that input data in bit positions according to which the proper voltages will be applied to corresponding bit lines BL[n-1:0] during programming. According to disclosed embodiments, an entire row of memory array 20 is programmed in a single programming cycle, based on the data states stored in read/write cache 24.

OTP 19 also includes cache controller 27, which receives and stores the row address applied to row decoder 25, and which controls the operation of read/write cache 24 during read operations, as will be described in detail below in connection with an embodiment.

Other circuitry, including precharge and bias circuitry for precharging and biasing bit lines BL[n-1:0], generating programming voltages, control signals, and the like, will be included within OTP 19, as typical for electrically-programmable memories as will be understood by those skilled in the art having reference to this specification.

Figure 4:
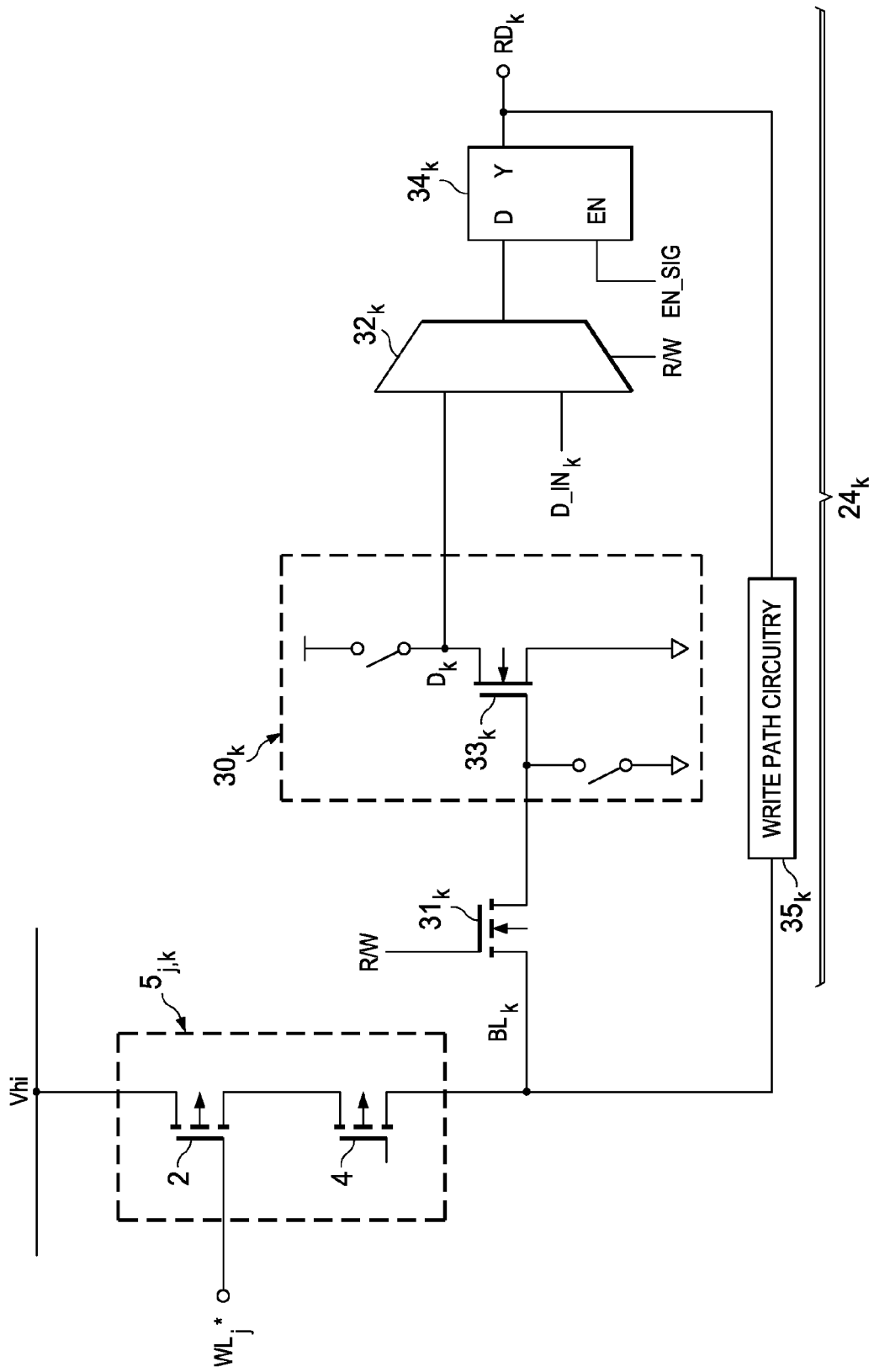
FIG. 4 is an electrical diagram, in schematic and block form, of the read path circuitry in a bit position in a read/write cache in the memory of FIG. 3, according to an embodiment.

FIG. 4 illustrates the construction of a bit position of read/write cache 24, in the form of cache bit circuitry $24_k$, according to an embodiment; in particular, FIG. 4 illustrates the detailed construction of an example of the read path circuitry in this cache bit circuitry $24_k$. It is contemplated that the number of instances of cache bit circuitry $24_k$ will correspond to the number n of bit lines BL[n-1:0] in a row of memory array 20. For the example of n=128, 128 instances of cache bit circuitry $24_k$ will be provided.

As shown in FIG. 4, cell $5_{j,k}$ is coupled to this read path circuitry via bit line $BL_k$ for its column k. As will be appreciated by those skilled in the art having reference to this specification, each cell 5 in the same column k as cell $5_{j,k}$ will similarly be coupled to bit line $BL_k$ of column k; the activation of one and only one of word lines $WL_j*$ will ensure that only a single cell 5 will be coupled to bit line $BL_k$ in an access. Bit line $BL_k$ is connected to the input of read amplifier $30_k$ via the source/drain path of protection transistor $31_k$, which has its gate receiving read/write signal R/W. Protection transistor $31_k$ operates to isolate the input of read amplifier $30_k$ from bit line $BL_k$ during programming events (i.e., with read/write signal R/W at a low logic level) during which bit line $BL_k$ may be raised to a very high voltage.

Figure 1:
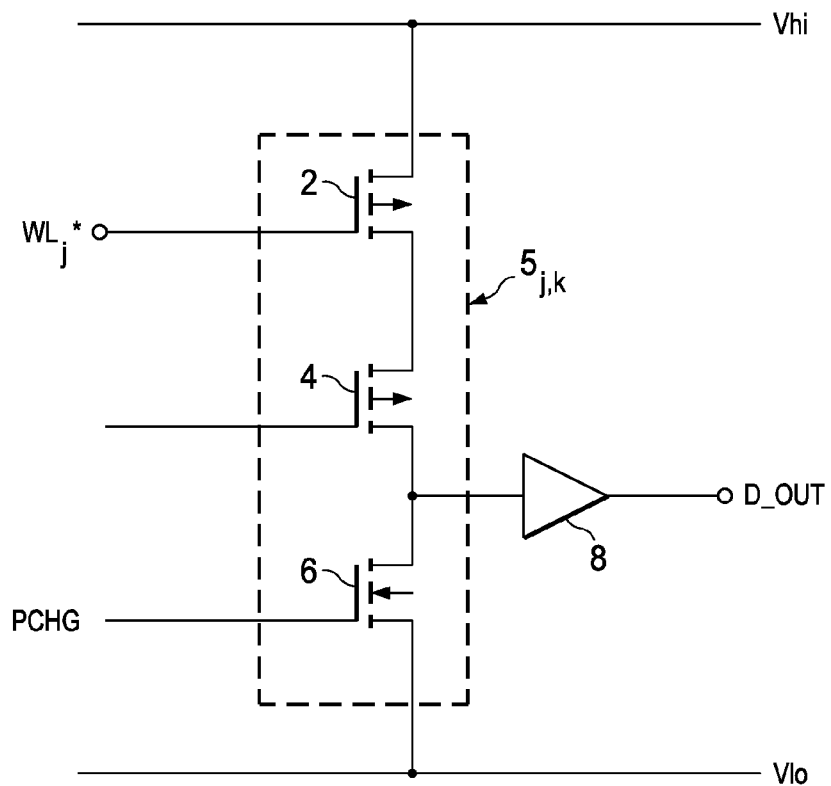
FIG. 1 is an electrical diagram, in schematic form, of a conventional non-volatile memory cell and read circuit.

Read amplifier $30_k$ in the read path of cache bit circuitry $24_k$ may be implemented according to any one of a number of circuit implementations. In the example of FIG. 4, read amplifier $30_k$ is implemented as dynamic logic (precharge/ discharge logic), in which n-channel transistor $33_k$ has its drain at node $D_k$ and its source at ground (i.e., voltage Vlo). As shown in FIG. 4, read amplifier $30_k$ includes a pair of switches that, when closed, precharge the drain and gate of transistor $33_k$ to voltage Vhi and ground, respectively. In this implementation, the switch within read amplifier 30k that biases the gate of transistor $33_k$ to ground allows cell $5_{j,k}$ to be constructed without a precharge transistor (e.g., without transistor 6 of FIG. 1), as shown in FIG. 4. Of course, cell $5_{j,k}$ may alternatively be implemented according to any one of a number of other arrangements, according to the desired memory cell technology. In operation, the pair of switches in read amplifier $30_k$ both close at the beginning of the read cycle, precharging the gate of transistor $33_k$ to ground and the drain of transistor $33_k$ to voltage Vhi; these switches then open, leaving those gate and drain nodes at their precharged levels. The state of bit line $BL_k$ will then determine whether node $D_k$ is discharged by transistor $33_k$ (bit line $BL_k$ at a high level, which turns on transistor $33_k$) or remains at its precharged level (bit line $BL_k$ at a low level, which leaves transistor $33_k$ off). This precharge/discharge operation provides excellent read performance with minimal power consumption. Alternatively, as mentioned above, read amplifier $30_k$ may be realized by way of other implementations as known in the art.

Node $D_k$ is coupled to one input of input/output multiplexer $32_k$, the other output of which receives input data signal $D\_IN_k$. The select input of input/output multiplexer $32_k$ is applied to the D input of latch $34_k$, which serves as a storage element for this bit position k of read/write cache 24. In this embodiment, latch $34_k$ is in the form of a transparent latch, having an enable input EN receiving enable signal EN_SIG, and an output Y that drives data line $RD_k$ that is forwarded to column select circuit 26 (FIG. 3). When latch $34_k$ is enabled by the signal at enable input EN, the data state received at its D input is immediately presented at output Y, and is retained at the end of the cycle, as known in the art for transparent latches. This implementation of latch $34_k$ as a transparent latch provides minimal delay in the read path, and thus assists in the read performance of OTP 19. Alternatively, the storage elements of read/write cache 24 may be implemented as another type of latch (e.g., a flip-flop), as a read/write memory cell (e.g., a static RAM cell), or as any other type of digital storage element, as may be selected by those skilled in the art having reference to this specification. The following description will refer to the storage elements of read/write cache 24 as latches $34_k$, by way of example and for consistency with FIG. 4, it being understood that such reference is not intended in a limiting sense.

In this embodiment, latch $34_k$ serves the memory function of read/write cache 24 for its associated bit position k. The number of latches $34_k$ within read/write cache 24 corresponds to the number of bit lines BL[n-1:0] in a row of memory array 20. And as evident from FIG. 4 for this embodiment, latch $34_k$ can store data read from a selected cell 5 in column k or data to be written as presented on data line $D\_IN_k$, depending on read/write signal R/W as applied to the select input of multiplexer $32_k$.

Figure 5:
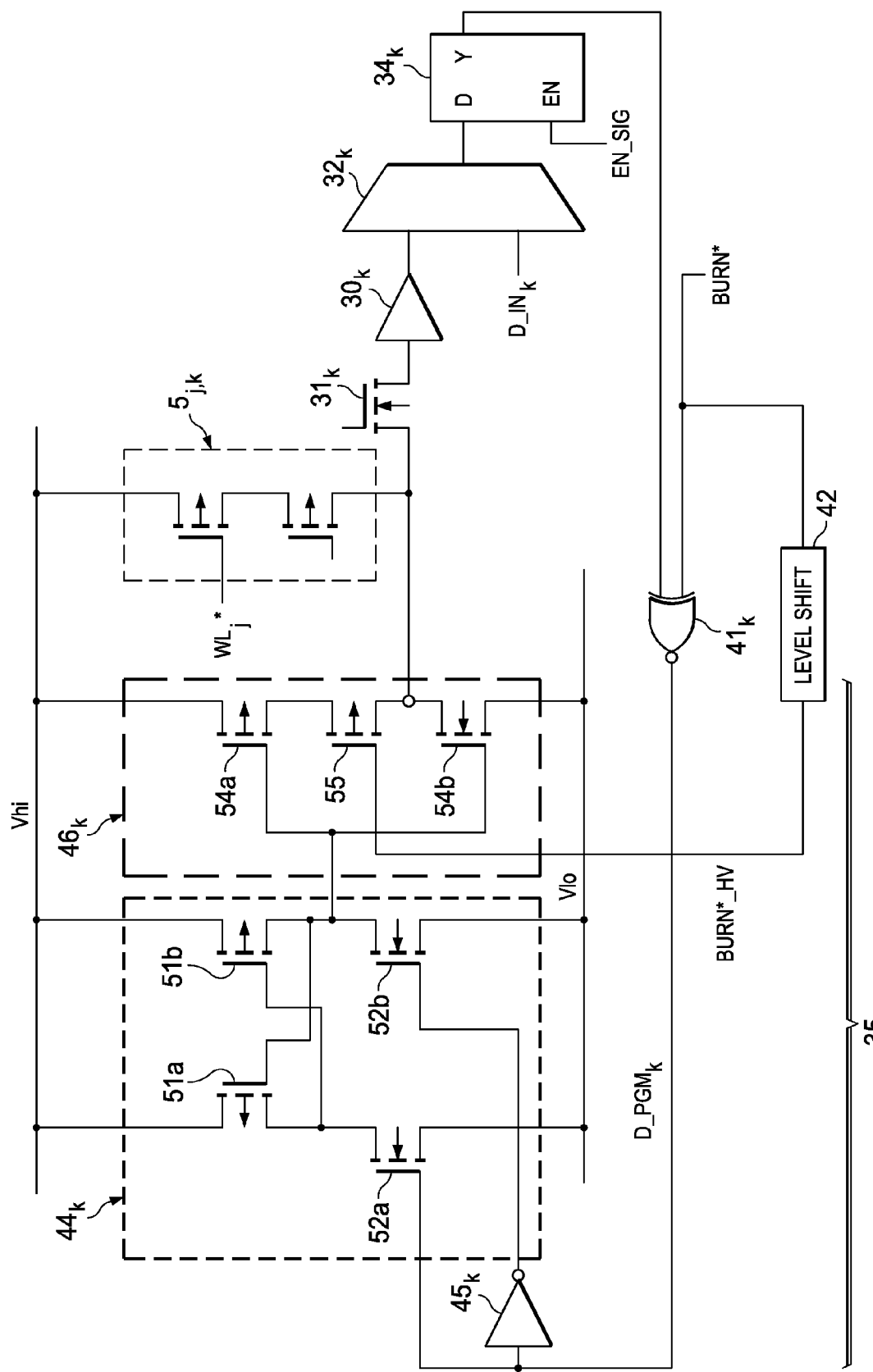
FIG. 5 is an electrical diagram, in schematic and block form, of the write path circuitry in a bit position in a read/write cache in the memory of FIG. 3, according to an embodiment.

FIG. 4 illustrates write path circuitry $35_k$ of cache bit circuitry $24_k$ as receiving the output of latch $34_k$ (read line $RD_k$) and forwarding that data to bit line $BL_k$, and thus to the source nodes of floating gate transistors 4 in cells 5 of column k in this implementation. Referring to FIG. 5, the construction of write path circuitry $35_k$ according to this embodiment will be described in further detail.

As shown in FIG. 5, output Y of latch $34_k$ is communicated to an input of NOR gate $41_k$ of write path circuitry $35_k$, which receives control signal BURN* at its other input. Control signal BURN* indicates, when energized at a low logic level, that a programming operation is to be performed. The output of NOR gate $41_k$ on line $D\_PGM_k$ is applied to level shifter $44_k$, in both polarities (the inverted polarity via inverter $45_k$). Level shifter $44_k$ may be constructed in the conventional manner so as to shift the voltage of the high logic level of line $D\_PGM_k$ to a voltage consistent with the increased voltage to which bias voltage Vhi is raised during programming (e.g., 18 volts).

In the example of FIG. 5, level shifter $44_k$ is constructed in a conventional manner, with two legs of series-connected transistors 51a, 52a; 51b, 52b. P-channel transistors 51a, 51b each have their source nodes at voltage Vhi, and their gates connected to each other's drain node in cross-coupled fashion. The drain of each of transistors 51a, 51b is connected to the drain of its corresponding n-channel transistor 52a, 52b, respectively, and both of transistors 52a, 52b have their source nodes at voltage Vlo. In this implementation, the gate of transistor 52a receives data line $D\_PGM_k$ and the gate of transistor 52b receives data line $D\_PGM_k$ after inversion by inverter $45_k$. The effect of level shifter $44_k$ is to present, at the common drain node between transistors 51b, 52b, an output logic signal at one of rail voltages Vhi, Vlo responsive to the logic level at data line $D\_PGM_k$. The high and low logic level voltages at data line $D\_PGM_k$ are thus shifted to the voltages Vhi, Vlo by level shifter $44_k$. In the programming operation, voltage Vhi is raised to an increased programming level (as compared with its bias level during read operations); as such, level shifter $44_k$ presents logic levels consistent with that increased voltage to driver logic $46_k$.

Driver logic $46_k$ receives the logic level at the output of level shifter $44_k$, and presents a corresponding voltage to bit line $BL_k$. In the implementation of FIG. 5, driver logic $46_k$ is constructed from a pair of p-channel transistors 54a, 55, with their source/drain paths connected in series between voltage Vhi and bit line $BL_k$, and n-channel transistor 54b with its source/drain path connected between bit line $BL_k$ and voltage Vlo. Bit line $BL_k$ in this example is connected to the common drain node of transistors 54b, 55. The gates of transistors 54a, 54b receive the output of level shifter $44_k$, and the gate of transistor 55 receives high voltage control signal BURN*_HV, which is generated from control signal BURN* by level shifter 42. Level shifter 42 is a level shifter circuit (e.g., similar to level shifter $34_k$) that shifts the logic voltages of control signal BURN* to levels consistent with the increased voltage Vhi in programming operations; control signal BURN*_HV refers to that shifted control signal, and is a negative logic signal (i.e., active at a low logic level). A single instance of level shifter 42 may be shared by multiple instances, if not all instances, of write path circuitry $35_k$, if desired.

In operation, NOR gate $41_k$ of write path circuitry $35_k$ receives the logic state of output Y reflecting the contents of latch $34_k$, and generates a logic level at data line $D\_PGM_k$ accordingly, based on the state of control signal BURN*. In a write operation, control signal BURN* will be at its logic low level, and as such the state of data line $D\_PGM_k$ will correspond to the state of output Y of latch $34_k$. This data state is level shifted by level shifter $44_k$ to present an level at either of the voltage rails Vhi, Vlo to driver logic $46_k$. In the implementation of FIG. 5, the output of level shifter $44_k$ will be at voltage Vhi if data line $D\_PGM_k$ is at a high logic level (transistor 52b being turned off), and at voltage Vlo if data line $D\_PGM_k$ is at a low logic level (transistor 52b being turned on).

As discussed above, level shifter 42 generates higher voltage logic signal BURN*_HV from control signal BURN*. In a read operation, control signal BURN* will be at an inactive high logic level, and as such signal BURN*_HV will be at increased voltage Vhi, which is sufficient to turn off transistor 55 in driver logic $46_k$ even if transistor $43_a$ is turned on from the output of level shifter $44_k$; this effectively disables driver logic $46_k$ from affecting the voltage at bit line $BL_k$. In a programming operation, however, control signal BURN*_HV will be at a low logic level, which turns on transistor 55. Control signal BURN*_HV may be pulsed to produce the programming pulses at bit line $BL_k$ if desired. While control signal BURN*_HV is at a low logic level, driver logic $46_k$ will behave as a conventional CMOS inverter responsive to the high voltage logic levels at the output of level shifter $44_k$, which of course responds to the data signal $D\_PGM_k$ and thus the contents of latch $34_k$. Driver logic 55 thus presents either a high (voltage Vhi) or low (voltage Vlo) at bit line $BL_k$, depending on the data state stored in latch $34_k$, during the active duration of control signal BURN*_HV.

During this programming operation, transistor $31_k$ is turned off by read/write signal R/W to isolate the input of read amplifier $30_k$ from the potentially high programming voltages at bit line $BL_k$, as mentioned above.

Figure 6A:
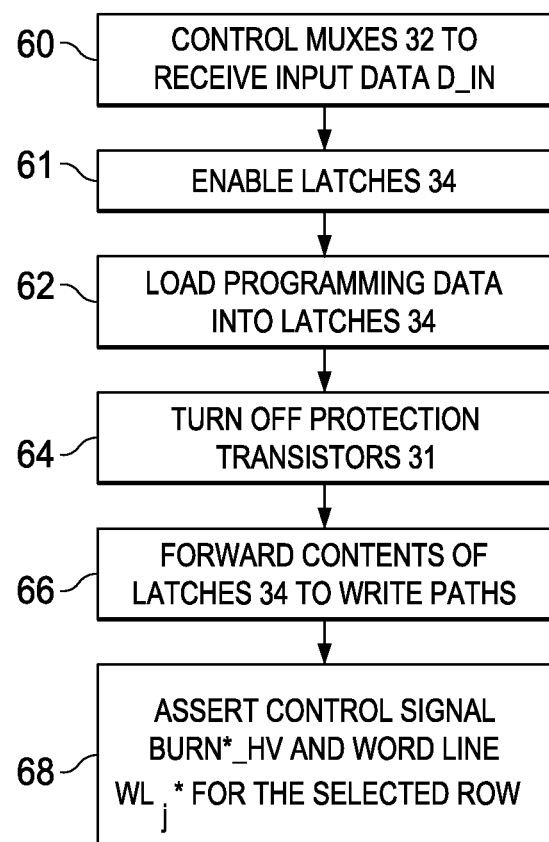
FIGS. 6a and 6b are flow diagrams illustrating the operation of the memory of FIG. 3 in performing programming and read operations, respectively, according to an embodiment.
Figure 6B:
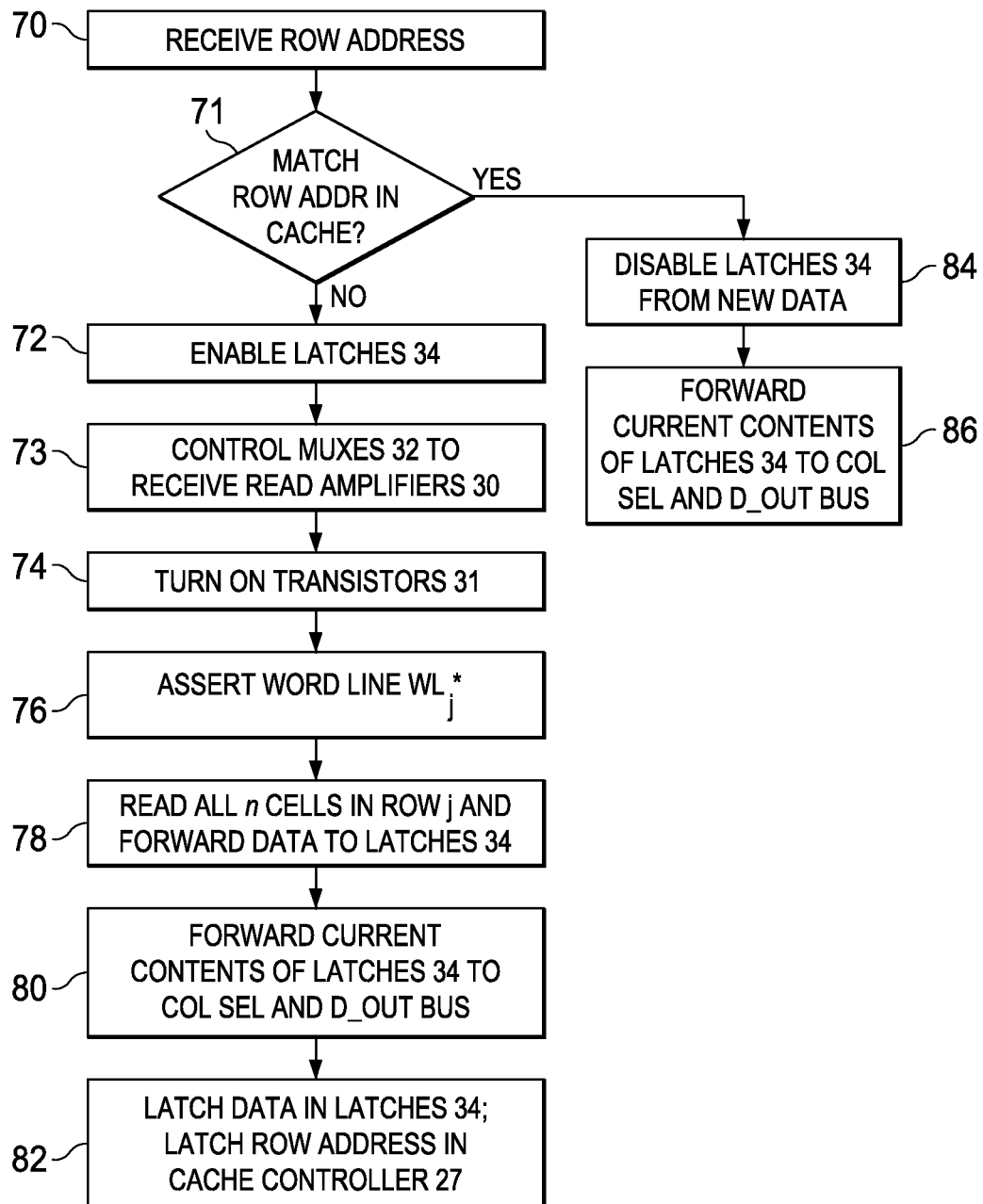

Referring now to FIGS. 6a and 6b, the overall operation of dual purpose read/write cache 24 in programming and read operations, respectively, as applied to memory array 20 in OTP 19, will now be described for an embodiment. It is contemplated that these operations, and the timing of those operations, will be controlled by way of the appropriate logic circuitry included within the integrated circuit 10 in which OTP 19 is realized. It is also contemplated that those skilled in the art having reference to this specification will be readily able to realize that control logic as appropriate for a particular implementation, without undue experimentation. For the case of OTP 19, it is of course contemplated that the programming operation of FIG. 6a will be performed prior to the read operations of FIG. 6b. Of course, if embodiments are implemented in other types of non-volatile memories, such as EEPROM or flash memory, the programming and read operations may be performed in any order, with erase operations performed as desired. In addition, those skilled in the art having reference to this specification will comprehend that some of the processes and steps described below in connection with these operations may be performed in a different order than that described herein, or in some cases omitted, depending on the particular implementation. As such, the following description is presented by way of example only.

Referring to FIG. 6a, the programming operation begins with process 60 in which read/write signal R/W is applied to the select inputs of multiplexers 32, to control each multiplexer $32_k$ to select its respective data input $D\_IN_k$ to be forwarded to the D input of its associated latch $34_k$. In process 61, enable signal EN_SIG is applied to latches 34 in read/write cache 24, enabling those latches 34 to receive and retain input data. And in process 62, the data to be programmed into cells 5 of a particular row j of memory array 20 are then loaded into latches 34 of read/write cache 24, via multiplexers 32.

It is contemplated that the loading of data into latches 34 may be performed in process 62 in smaller units of data than an entire row, for example, to reduce the number of data lines required to be routed to read/write cache 24. For example, data may be loaded into latches 34 byte-by-byte (i.e., eight bits at a time), in succession. In that case, one or both of processes 60, 61 may similarly be repeated for each group of data as written. For the example of byte-by-byte loading of data, process 61 may be performed to enable eight latches 34, followed by the presenting of data for those eight bit positions in process 62; processes 61 and 62 would then be repeated for the next byte to be written, and so on until all latches 34 in read/write cache 24, for the entire row, are loaded with the data to be programmed into the row of cells 5 in memory array 20.

In process 64 and in advance of the programming operation, protection transistors 31 are turned off by read/write signal R/W. Voltage Vhi is raised to its desired programming voltage at or prior to this stage of the operation. In process 66, the contents of latches 34, for the entire row, are forwarded to corresponding instances of write path circuitry 35 to present the data to be programmed, as stored in read/write cache 24, to driver logic 35 associated with each of the bit lines BL[n-1:0]. Programming is then performed in process 68 by the assertion of word line $WL_j$* for the selected row and the assertion of control signal BURN*_HV to all instances of driver logic 35. The data states stored in latches 34, as forwarded to driver logic 35, determine the state of their associated bit lines BL[n-1:0], and thus the bias applied to floating-gate transistors 4 in cells 5 of the selected row in this programming cycle. As a result of process 68, cells 5 in the entire row j corresponding to word line $WL_j$* are simultaneously programmed with the desired data. As mentioned above, programming process 68 may be performed by a single programming pulse or by a series of pulses, depending on the particular implementation.

The process of FIG. 6a is then repeated for other rows in memory array 20, in order to program the desired information into OTP 19. Read/write latch 24 is again loaded with the data to be programmed into the next row by processes 61, 62, which rewrites the contents of latches 34 from the contents retained from the previously programmed row. This use of read/write cache 24 as a write cache for the programming operation enables the simultaneous programming of an entire row of memory array 20. For memory architectures in which the row width is relatively wide (e.g., 128 bits wide), this function of read/write cache 24 will significantly reduce the time required to program memory array 20 from that which would be required in conventional memories in which fewer bits (e.g., a byte or data word) are programmed by each programming cycle. As discussed above in connection with the Background of the Invention, this reduced overall programming time will save significant test time and thus cost, particularly in the manufacture of one-time programmable memories.

According to the disclosed embodiments, read/write cache 24 is "repurposed" after programming is complete, to then serve as a read cache in the reading of the programmed data from memory array. This operation of read/write cache 24 as a read cache will now be described with reference to FIG. 6b.

According to this embodiment, the reading of data from memory array 20 begins with process 70 in which a row address is received by row decoder 25. This row address of course indicates the one of word lines WL*[m-1:0] to be asserted in the read cycle to be performed. In process 71, cache controller 27 compares this row address to the row address of data currently in read/write cache 24 (i.e., data currently retained in latches 34 of read/write cache 24 from a previous read cycle). If the newly-received row address does not match (decision 71 returns a "no" result), then cells 5 in the row corresponding to the newly-received row address are to be accessed.

The read access and cache loading for a newly addressed row begins with process 72 in which latches 34 are enabled by assertion of enable signal EN_SIG to receive and retain a data state at its D input. In process 73, the appropriate logic state of read/write signal R/W is applied to the select inputs of multiplexers 32, causing each of those multiplexers 32 to select the output of its corresponding read amplifier 30 for forwarding to its associated latch 34. In process 74, protection transistors 31 in read/write cache 24 are turned on; in the example shown in FIG. 4, this may be performed at the same time as process 73, if both functions are effected by read/write signal R/W. At this point in the process, prior to the assertion of one of word lines WL*[m-1:0], read amplifiers 30 may be precharged if implemented as dynamic logic, as described above relative to the example of FIG. 4.

In process 76, word line $WL_j^*$ is asserted (at its active low level, for the example of cells 5 described above), which applies voltage Vhi at the appropriate read level to the floating-gate transistors 4 in cells 5 in selected row j, as described above. This causes the state of floating-gate transistors 4 in cells 5 of selected row j to be reflected at bit lines BL[n-1:0], and applied to respective read amplifiers 30; in the architecture described above relative to FIG. 4, these data states are then forwarded to respective transparent latches 34, all in process 78. Because the entire row is selected by the assertion of word line $WL_j^*$ and because an instance of read amplifier 30 is provided for each of bit lines BL[n-1:0], the data states of the entire row j of cells 5 are read in a single read cycle in this process 78. In process 80, the data read from this row j are forwarded in parallel to column select circuit 26 (FIG. 3) which, according to the received column address, selects the desired number of bits for forwarding to output data bus D_OUT. In process 82, these data states are latched into latches 34 at the end of this read cycle, for example by deasserting enable signal EN_SIG. Also in process 82, the row address for row j that was read in this read cycle is stored in cache controller 27.

Following the loading of latches 34 with data read from a row of cells 5 in memory array 20, as occurs via processes 72 through 82 described above, read/write cache 24 in its function as a read cache is loaded with the most recently accessed row of data, awaiting the next read cycle. According to this embodiment, the operation of read/write cache 24 as a read cache allows the next read cycle to read the data stored in read/write cache 24 if the memory address corresponds to that of the data retained by latches 34, rather than accessing a row of cells 5 in memory array 20.

According to this embodiment, in which read/write cache 24 stores data read from a full row of cells 5, this "cache hit" situation occurs if the row address for the next read cycle matches that of the most recently accessed row, which is stored in cache controller 27 as mentioned above. As shown in FIG. 6b, decision 71 determines whether this next read cycle is accessing the recently accessed row, by comparing the row address of this next cycle with that stored in cache controller 27. If so (decision 71 is "yes"), then latches 34 are disabled from forwarding and latching new data presented at its D inputs in process 84, for example by deasserting enable signal EN_SIG. Because the data for the addressed row is already retained in read/write cache 24, the current content of latches 34 are then forwarded to column select circuitry 26 for selection of the desired portion according to the column address value for this read cycle, and forwarding of those selected data bits on output data bus D_OUT, all in process 86. In addition, if desired, cache controller 27 may issue a control signal to row decoder 25 in the event of a cache hit (as suggested in FIG. 3), to inhibit row decoder 25 from energizing a word line corresponding to the received row address, thus saving additional power from being consumed. The reading of data from read/write cache 24 is then complete, and the next cycle is awaited.

These disclosed embodiments are contemplated to provide particular advantages in the architecture and performance of non-volatile memories. The repurposing, or dual use, of a read/write cache as both a write cache and a read cache provides important efficiencies in the implementation of the memory, especially as compared with the chip area that would be required to provide separate dedicated caches. It is observed that the read access of an entire row, and the operation of read amplifiers for the full row, as described in these embodiments, may increase the current consumption of a single read access relative to that of a conventional architecture in which column select circuitry selects a subset of the bit lines for sensing and amplification. However, it is also observed that a read from the read/write cache will consume much less power than a read access of the memory array. Accordingly, it is believed that the provision and operation of a read/write cache as described above can reduce power consumption in many implementations. In the particular case of a one-time programmable memory, which is typically used for program memory, it is believed that a large majority of the data accesses will be from sequential addresses as a sequence of program instructions are fetched in normal operation. Accordingly, it is believed that this embodiment of the invention will be especially well-suited to not only reduce programming time by virtue of its ability to program an entire row simultaneously, but may also significantly reduce the power consumed by the memory in its normal operation.

In addition, it is contemplated that the read path of the memory architecture according to this embodiment provides excellent read performance, both in its read access time and also in its read margin. The read access time from the read/write cache is contemplated to be very short as compared with an access to the array. In addition, the column select circuitry is able to operate upon data states at full logic levels, as provided by the storage elements of the read/write cache, rather than on bit line levels; as a result, signal degradation caused by the parasitic impedances presented by the column select multiplexers is contemplated to be much less significant than in conventional architectures.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A programmable non-volatile memory, comprising:
   an array of floating-gate memory cells arranged in rows and columns, the memory cells in each column sharing a bit line;
   a row decoder, for selecting a row of memory cells in the array responsive to a row address;
   a read/write cache, coupled to a plurality of bit lines corresponding to a plurality of columns in the array, and having an input for receiving data to be programmed into a plurality of columns in the array, the read/write cache comprising, for each of a plurality of columns in the array:
      a storage element for storing a data state associated with the corresponding column;
      read path circuitry coupled between the bit line for the corresponding column and the storage element, the read path circuitry having a protection transistor; and write path circuitry coupled between the storage element and the bit line for the corresponding column; and a column select circuit, coupled to the storage elements of the read/write cache, for receiving the data states stored in the storage elements and for selecting a subset of the received data states responsive to a column address.

2. The memory of claim 1, wherein the plurality of bit lines coupled to the read/write cache comprise the bit lines for a full row of the memory array.

3. The memory of claim 1, wherein the read path circuitry of the read/write cache for each of the plurality of columns comprises:

a read amplifier, having an input coupled to the bit line for the corresponding column, and having an output; and a multiplexer, having a first input coupled to the output of the read amplifier, having a second input receiving a data state from the input for receiving data to be programmed, having a select input receiving a read/write control signal, and having an output coupled to an input of the storage element;

wherein the protection transistor has a source/drain path coupled between the bit line for the corresponding column and the input of the read amplifier, and a gate for receiving a read/write control signal.

4. The memory of claim 3, wherein the read amplifier comprises a dynamic logic amplifier.

5. The memory of claim 3, wherein the write path circuitry of the read/write cache for each of the plurality of columns comprises:

a level shifter circuit, coupled to the output of the storage element, and biased by a programming voltage, to produce a level-shifted version of the data state stored by the storage element;

driver logic circuitry, having an input coupled to an output of the level shifter circuit, having an input receiving a programming control signal, and having an output coupled to the bit line of the corresponding column.

6. The memory of claim 1, wherein the storage element comprises a latch.

7. The memory of claim 6, wherein the latch is a transparent latch.

8. The memory of claim 1, wherein the storage element comprises a read/write memory cell.

9. The memory of claim 1, further comprising:

a cache controller, having an input receiving at least a portion of the row address, and having an output coupled to the read/write cache, the cache controller for storing a row address value corresponding to the row of the array corresponding to the contents of the storage elements of the read/write cache;

wherein each of the storage elements of the read/write cache have an enable input coupled to the output of the cache controller so that, responsive to the received row address value matching the stored row address value, the storage elements of the read/write cache are disabled from altering their stored data states.

10. The memory of claim 1, wherein each memory cell comprises:

a floating-gate transistor having a source/drain path and a floating gate electrode;

a precharge transistor, having a source/drain path connected to the source/drain path of the floating-gate transistor at a node coupled to the bit line associated with the memory cell, and having a gate receiving a precharge signal; and a select transistor, having a source/drain path connected in series with the source/drain paths of the floating-gate transistor and the precharge transistor, and having a gate receiving a word line associated with the row in which the memory cell resides.

11. A method of programming and accessing a non-volatile solid-state memory comprising an array of floating-gate memory cells arranged in rows and columns, the memory cells in each column sharing a bit line and the memory cells in each row sharing a word line, the method comprising the steps of:

programming a plurality of memory cells in a row of the array, comprising:

loading data for the plurality of memory cells into a read/write cache;

energizing a word line corresponding to a row address value; and then biasing bit lines associated with the plurality of memory cells according to the contents of the read/write cache; and then reading a first plurality of memory cells in a row of the array, comprising:

receiving a first row address value;

energizing a word line corresponding to the first row address value;

then storing, in the read/write cache, data states corresponding to the state at a plurality of bit lines corresponding to a plurality of memory cells in the row corresponding to the first row address value;

storing the first row address value; and forwarding a subset of the stored data states as output data;

then reading a second plurality of memory cells in a row of the array, comprising:

receiving a second row address value;

comparing the second row address value to the stored first row address value; and responsive to the second row address value matching the stored first row address value, forwarding a subset of the stored data states in the read/write cache as output data.

12. The method of claim 11, wherein each of the reading steps further comprises:

receiving a column address value;

and wherein the forwarding step comprises selecting the subset of stored data states responsive to the received column address value.

13. The method of claim 12, wherein the step of reading the second plurality of memory cells further comprises:

responsive to the second row address value not matching the stored first row address value:

energizing a word line corresponding to the second row address value;

then storing, in the read/write cache, data states corresponding to the state at a plurality of bit lines corresponding to a plurality of memory cells in the row corresponding to the second row address value;

storing the second row address value; and forwarding a subset of the stored data states as output data.

* * * * *